United States Patent
So et al.

(10) Patent No.: US 7,488,982 B2
(45) Date of Patent: Feb. 10, 2009

(54) THIN FILM TRANSISTOR AND MANUFACTURING METHOD THEREOF, AND ACTIVE MATRIX DISPLAY DEVICE AND MANUFACTURING METHOD THEREOF

(75) Inventors: Woo Young So, Suwon (KR); Kyung Jin Yoo, Suwon (KR); Sang Il Park, Seoul (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 0 days.

(21) Appl. No.: 10/068,004

(22) Filed: Feb. 8, 2002

(65) Prior Publication Data

US 2002/0121639 A1   Sep. 5, 2002

(30) Foreign Application Priority Data

Mar. 2, 2001   (KR) ............... 2001-10842

(51) Int. Cl.
*H01L 29/04*   (2006.01)
(52) U.S. Cl. ............... 257/72; 257/59; 257/347; 257/E21.605; 257/E27.111; 257/E29.003; 438/149; 438/479; 438/517
(58) Field of Classification Search ............... 257/72, 257/59, 347; 438/149, 479, 517, 48
See application file for complete search history.

(56) References Cited

U.S. PATENT DOCUMENTS

| | | | | |
|---|---|---|---|---|
| 4,072,974 A | * | 2/1978 | Ipri .................. | 257/351 |
| 5,550,066 A | * | 8/1996 | Tang et al. ............ | 437/40 |
| 5,568,288 A | * | 10/1996 | Yamazaki et al. ....... | 349/42 |
| 5,723,879 A | * | 3/1998 | Cho et al. ............. | 257/60 |
| 5,771,110 A | * | 6/1998 | Hirano et al. .......... | 257/72 |
| 5,837,568 A | * | 11/1998 | Yoneda et al. .......... | 438/147 |
| 5,897,344 A | * | 4/1999 | Teramoto et al. ........ | 438/149 |
| 5,904,508 A | * | 5/1999 | Codama et al. ......... | 438/151 |
| 5,962,897 A | * | 10/1999 | Takemura et al. ....... | 257/347 |
| 5,990,530 A | | 11/1999 | Suzuki | |
| 6,013,928 A | * | 1/2000 | Yamazaki et al. ....... | 257/347 |
| 6,017,783 A | * | 1/2000 | Yamazaki et al. ....... | 438/164 |
| 6,046,547 A | | 4/2000 | Nishio et al. | |
| 6,071,783 A | * | 6/2000 | Liang et al. ........... | 438/301 |
| 6,072,194 A | * | 6/2000 | Wakita et al. .......... | 257/66 |
| 6,198,133 B1 | * | 3/2001 | Yamazaki et al. ....... | 257/347 |
| 6,492,210 B2 | * | 12/2002 | Wieczorek et al. ...... | 438/149 |
| 6,549,252 B1 | * | 4/2003 | Lee et al. ............. | 349/47 |
| 6,706,569 B2 | * | 3/2004 | Kim et al. ............. | 438/149 |
| 2002/0105033 A1 | * | 8/2002 | Zhang .................. | 257/353 |
| 2002/0145142 A1 | * | 10/2002 | Chen et al. ............ | 257/66 |
| 2002/0153527 A1 | * | 10/2002 | Chang et al. ........... | 257/70 |
| 2003/0071306 A1 | * | 4/2003 | Huang et al. ........... | 257/344 |
| 2003/0207502 A1 | * | 11/2003 | Yamazaki et al. ....... | 438/149 |
| 2004/0041190 A1 | * | 3/2004 | Yamazaki et al. ....... | 257/300 |
| 2004/0072393 A1 | * | 4/2004 | Yamazaki et al. ....... | 438/149 |

(Continued)

FOREIGN PATENT DOCUMENTS

EP   717 439   *   6/1996

(Continued)

*Primary Examiner*—Ahmed Sefer
(74) *Attorney, Agent, or Firm*—Stein, McEwen & Bui, LLP (57) ABSTRACT

A method of manufacturing a thin film transistor (TFT) which is manufactured such that source and drain electrodes directly contact source and drain regions without contact holes.

20 Claims, 12 Drawing Sheets

U.S. PATENT DOCUMENTS

2007/0210451 A1 * 9/2007 Ohtani et al. ............... 257/734

FOREIGN PATENT DOCUMENTS

| EP | 1 139 453 | * | 10/2002 |
| --- | --- | --- | --- |
| JP | 5-121435 | * | 5/1993 |
| JP | 6-124962 | | 5/1994 |
| JP | 7-78782 | | 3/1995 |
| JP | 9-74201 | | 3/1997 |
| JP | 10-32329 | | 2/1998 |
| JP | 10-189252 | | 7/1998 |
| JP | 10-232628 | | 9/1998 |
| JP | 11-44892 | * | 2/1999 |
| JP | 11-97704 | | 4/1999 |
| JP | 11-111992 | * | 4/1999 |
| JP | 11-261076 | * | 9/1999 |
| KR | 2000-46960 | | 7/2000 |

* cited by examiner

FIG.8

THIN FILM TRANSISTOR AND MANUFACTURING METHOD THEREOF, AND ACTIVE MATRIX DISPLAY DEVICE AND MANUFACTURING METHOD THEREOF

CROSS-REFERENCE TO RELATED APPLICATIONS

This application claims the benefit of Korean Patent Application No. 2001-10842, filed on Mar. 2, 2001, in the Korean Industrial Property Office, the disclosure of which is incorporated herein by reference.

BACKGROUND OF THE INVENTION

1. Field of the Invention

The present invention relates to a thin film transistor (TFT), and more particularly, to a method of manufacturing the same. Also, the present invention relates to an active matrix display device and a manufacturing method thereof.

2. Description of the Related Art

As a type of flat panel display device, an organic electroluminesence (EL) display device is being watched with keener interest than any other display device, such as a cathode ray tube (CRT) and a liquid crystal display (LCD) device. In comparison to the CRT having the same screen size, the organic EL display device is thin, lightweight, and has lower power consumption. Since the organic EL display device emits light by itself, it does not require a back light device. Therefore, a lightweight, small-sized and compact display device can be achieved. In addition, the organic EL display device has an advantage in that there is no limitation to a viewing angle. As such, organic EL display device having a thin film transistor (TFT) as a switching element is being actively developed.

Figure 1:
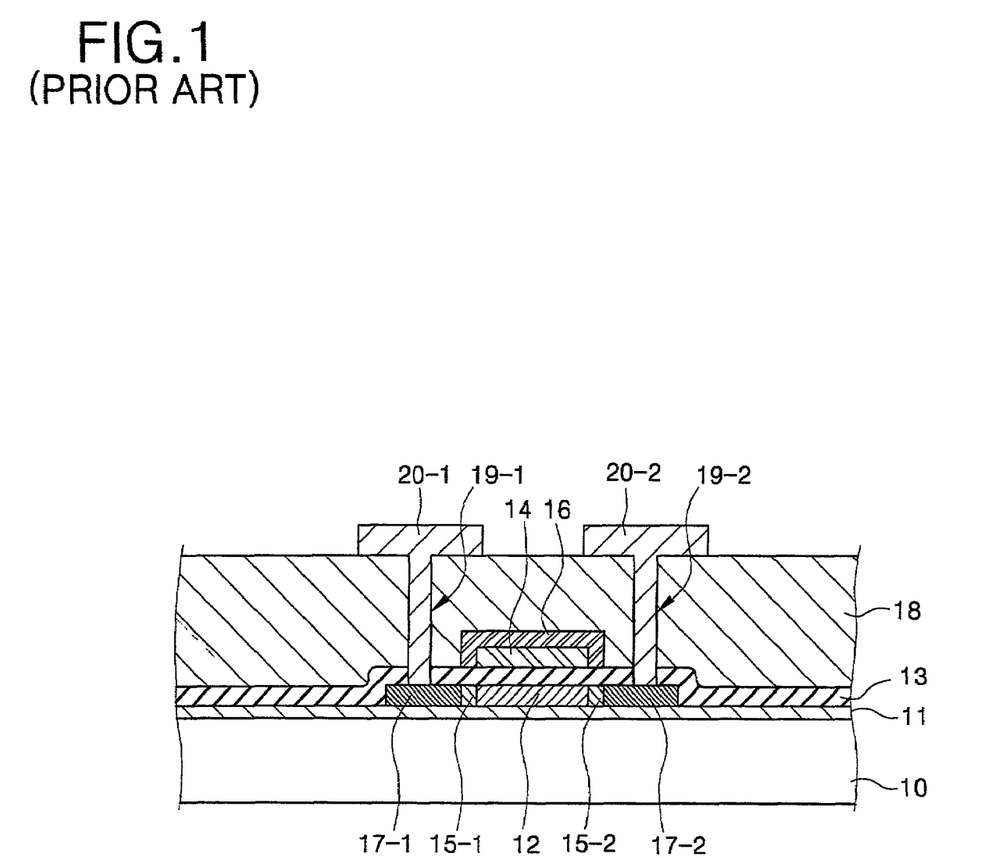
FIG. 1 is a diagram illustrating a cross-sectional view of a conventional TFT.

FIG. 1 is a cross-sectional view illustrating a conventional TFT. A process of manufacturing the conventional TFT is described below with reference to FIG. 1. First, a buffer layer 11 is formed on a transparent insulating substrate ("substrate") 10. The substrate 10 is a transparent glass substrate or a transparent plastic substrate. A polycrystalline silicon layer is deposited on the buffer layer 11 and then patterned to form a semiconductor layer 12.

Then a first insulating layer 13 is deposited over the Whole surface of the substrate 10 as well as covering the semiconductor layer 12. The first insulating layer 13 serves as a gate insulating layer. A first metal layer is deposited on the first insulating layer 13 over the semiconductor layer 12 and then patterned to form a gate electrode 14. Using the gate electrode 14 as a mask, a low-density impurity, such as a n-type or a p-type low-density impurity, is ion-implanted into both end portions of the semiconductor layer 12 to form low-density source and drain regions 15-1 and 15-2.

Thereafter, the gate electrode 14 is anodized to form an anodizing layer 16 surrounding the gate electrode 14. For example, the anodizing layer is made of $Al_2O_3$, if the gate electrode is made of Al. A high-density impurity having the same conductivity as the low-density source and drain regions 15-1 and 15-2 is ion-implanted into portions of the low-density source and drain regions 15-1 and 15-2 that are not covered with the anodizing layer 16 to form source and drain regions 17-1 and 17-2.

Subsequently, a second insulating layer 18 is deposited over the whole surface of the substrate 10 and then patterned to form first and second contact holes 19-1 and 19-2. The first contact hole 19-1 is formed at a location corresponding to a portion of the source region 17-1, and the second contact hole 19-2 is formed at a location corresponding to a portion of the drain region 17-2. The second insulating layer 18 serves as an interlayer insulator.

Finally, a second metal layer is deposited on the interlayer insulator 18 and patterned to form source and drain electrodes 20-1 and 20-2. The source and drain electrodes 20-1 and 20-2 contact the source and drain regions 17-1 and 17-2 through the first and second contact holes 19-1 and 19-2, respectively. Therefore, the TFT having a lightly doped drain (LDD) structure is completed.

In order to manufacture a TFT having an off-set structure, a process of ion-implanting the low-density impurity is omitted.

The manufacture of the TFT having the LDD structure or the off-set structure requires four mask processes. A first mask forms the semiconductor layer 12. A second mask forms the gate electrode 14. A third mask forms the contact holes 19-1 and 19-2. A fourth mask forms the source and drain electrodes 20-1 and 20-2. Thus makes the manufacture of a conventional TFT very complicated and costly.

Also, the conventional method of manufacturing the TFT uses the anodizing layer 16 other than a photoresist pattern, and thus forms the LDD region in a self-aligning manner. However, an additional apparatus is necessary to anodize the gate electrode 14 and form the anodizing layer 16, leading to a very complicated manufacturing process.

In addition, since the source and drain electrodes 20-1 and 20-2 contact the high-density source and drain regions 17-1 and 17-2, a contact resistance increases, thereby degrading electric characteristics of the TFT.

Figure 2:
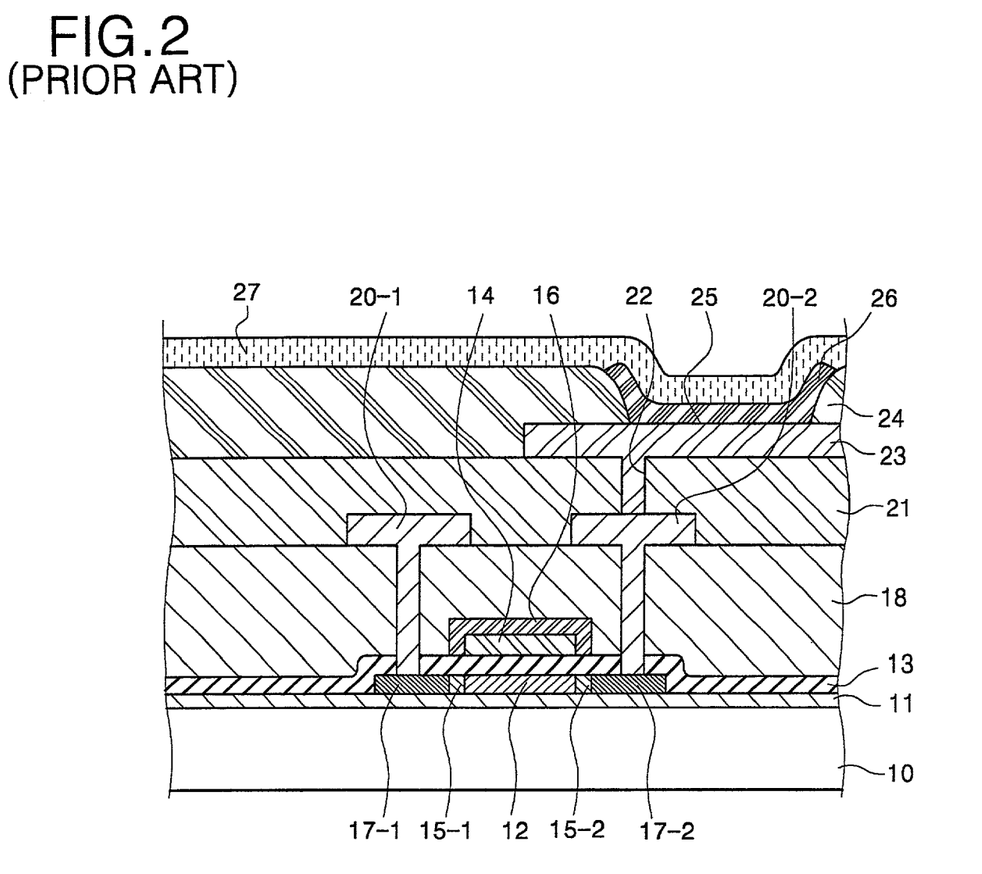
FIG. 2 is a diagram illustrating a cross-sectional view of a conventional organic EL display device having the TFT of FIG. 1 as a switching element.

FIG. 2 is a cross-sectional view illustrating a conventional organic EL display device having the TFT of FIG. 1 as a switching element. Subsequent to the process of manufacturing the TFT shown in FIG. 1, a third insulating layer 21 is formed over the whole surface of the substrate 10 so as to cover the source and drain electrodes 20-1 and 20-2. The third insulating layer 21 serves as a passivation layer. The passivation layer 21 includes a through hole 22 at a location corresponding to a portion of either of the source and drain electrodes 20-1 and 20-2. In FIG. 2, the through hole 20 is formed on a portion of the drain electrode 20-2.

Then, a transparent conductive material is deposited and patterned to form a pixel electrode 23. The pixel electrode 23 contacts the drain electrode 20-2 through the through hole 22 and serves as an anode electrode 23.

Subsequently, a planarization layer 24 is formed over the whole surface of the substrate 10. The planarization layer 24 has an opening portion 25. The opening portion 25 exposes a portion of the anode (pixel) electrode 23.

Next, an organic EL layer 26 is formed on the exposed portion of the anode electrode 23. Finally, the organic EL display device is completed when a cathode electrode 27, which covers the organic EL layer 26.

In order to manufacture the organic EL display device shown in FIG. 2, three mask processes are required in addition to the four mask processes required to manufacture the TFT. A fifth mask forms the through hole 22. A sixth mask forms the anode electrode 23. A seventh mask forms the opening portion 25. These additional processing operations and time complicate the manufacturing process of the organic EL display device. As a result, the manufacturing yield is low, and the production cost is high.

SUMMARY OF THE INVENTION

To overcome the above and other problems, it is an object of the present invention to provide a thin film transistor and an active matrix crystal display device having a simplified manufacturing process leading to a high manufacturing yield and a low production cost.

It is another object of the present invention to provide a thin film transistor and an active matrix display device having excellent electric characteristics.

Additional objects and advantages of the invention will be set forth in part in the description which follows and, in part, will be obvious from the description, or may be learned by practice of the invention.

To achieve the above and other objects of the present invention, there is provided a method of manufacturing a thin film transistor (TFT), comprising forming a semiconductor layer on an insulating substrate using a first mask, forming a gate insulating layer over the whole surface of the substrate, forming a gate electrode having a capping layer thereon using a second mask, forming spacers on both side wall portions of the gate electrode and the capping layer over the gate insulating layer while exposing both end portions of the semiconductor layer, forming high-density source and drain regions by ion-implanting a high-density impurity into the exposed portions of the semiconductor layer, and forming source and drain electrodes without contact holes, using a third mask to directly contact the high-density source and drain regions, respectively.

According to an aspect of the invention, the forming of the spacers includes depositing an insulating layer over the whole surface of the substrate and patterning the insulating layer and the gate insulating layer to form the spacers so as to expose both end portions of the semiconductor layer, where the insulating layer for the spacers and the capping layer is made of an oxide layer or a nitride layer, and the high-density source and drain regions are formed at a predetermined distance from the gate electrode so as to have the semiconductor layer with offset regions formed under the spacers.

According to another aspect of the invention, the method of manufacturing the TFT further includes forming low-density source and drain regions by ion-implanting a low-density impurity having the same conductivity type as the high-density impurity into the semiconductor layer after the forming of the gate electrode, so as to have the semiconductor layer with LDD regions formed under the spacers, where the capping layer serves as an impurity barrier to shield the gate electrode from being ion-implated during the process of ion-implanting the low-density impurity.

According to yet another aspect of the invention, the method of manufacturing the TFT further includes forming silicide layers on the exposed portions of the semiconductor layer after the forming of the spacers.

According to another embodiment of the present invention, a thin film transistor (TFT) includes a semiconductor layer formed on an insulating substrate, a gate insulating layer formed on the semiconductor layer so as to expose both end portions of the semiconductor layer, a gate electrode formed on the gate insulating layer, a capping layer formed on the gate electrode, spacers formed on the gate insulating layer and on both side wall portions of the gate electrode and the capping layer, high-density source and drain regions formed at the exposed end portions of the semiconductor layer beyond the spacers, and source and drain electrodes which directly contact the high density source and drain regions, respectively.

According to an aspect of the invention, the semiconductor layer has off-set regions formed under the spacers, the semiconductor layer has low-density source and drain regions having the same conductivity as the high-density source and drain regions under the spacers so as to have the semiconductor layer with LDD regions under the spacers.

According to another aspect of the invention, the capping layer and the spacers are made of an oxide layer or a nitride layer, and the TFT further comprises silicide layers formed both between the source electrode and the high-density source region, and between the drain electrode and the high-density drain region.

According to a further aspect of the present invention, a method of manufacturing an active matrix display device includes forming a semiconductor layer on an insulating substrate using a first mask, forming a first insulating layer over the whole surface of the substrate, forming a gate electrode having a capping layer thereon using a second mask, forming spacers on both side wall portions of the gate electrode and the capping layer over the first insulating layer while exposing both end portions of the semiconductor layer, forming high-density source and drain regions by ion-implanting a high-density impurity into the exposed portions of the semiconductor layer, forming source and drain electrodes without contact holes using a third mask, so as to directly contact the high-density source and drain regions, respectively, forming a second insulating layer over the whole surface of the substrate, forming an opening portion by etching the second insulating layer using a fourth mask and exposing either a portion of the source electrode or a portion of the drain electrode, and forming a pixel electrode on the second insulating layer to contact an area exposed by the opening portion.

According to a further embodiment of the present invention, an active matrix display device includes a semiconductor layer formed on an insulating substrate, a gate insulating layer formed on the semiconductor layer so as to expose both end portions of the semiconductor layer, a gate electrode formed on the gate insulating layer, a capping layer formed on the gate electrode, spacers formed on the gate insulating layer and on both side wall portions of the gate electrode and the capping layer, high-density source and drain regions formed to the exposed end portions of the semiconductor layer beyond the spacers, source and drain electrodes which directly contact the high density source and drain regions, respectively, a planarization layer having an opening portion which exposes either a portion of the source electrode or a portion of the drain electrode, and a pixel electrode formed on the planarization layer which contacts an area exposed by the opening portion.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 3A to 3L are diagrams of cross-sectional views illustrating a method of manufacturing a TFT according to an embodiment of the present invention;

FIGS. 5A to 5F are diagrams of cross-sectional views taken along line V-V of FIG. 4 illustrating a method of manufacturing a organic EL display device according to another embodiment of the present invention having the TFT of FIG. 3L;

DETAILED DESCRIPTION OF THE PREFERRED EMBODIMENTS

Reference will now be made in detail to preferred embodiments of the present invention, examples of which are illustrated in the accompanying drawings, wherein like reference numerals refer to the like elements throughout. The embodiments are described below in order to explain the present invention by referring to the figures.

Figure 3A:
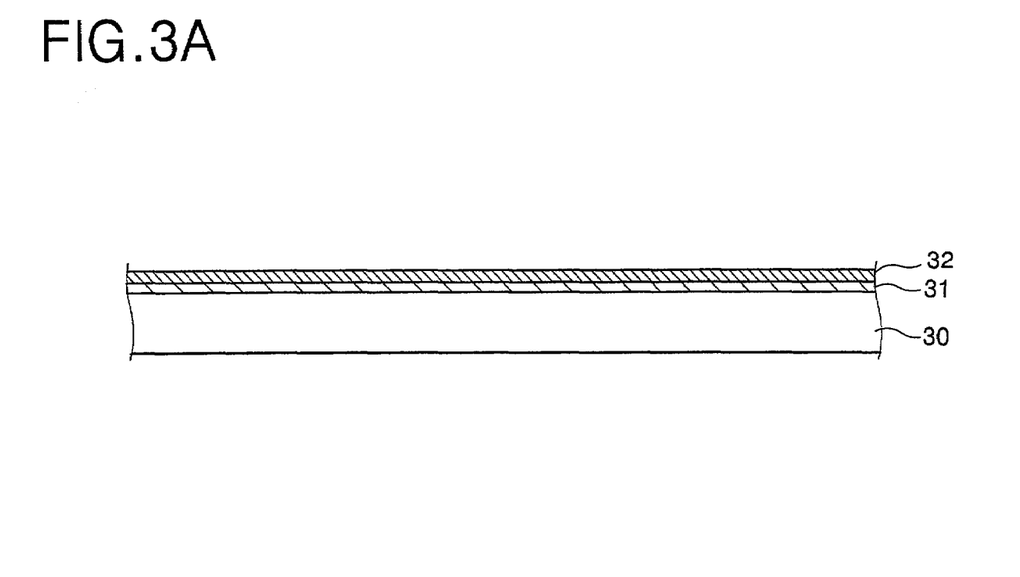
Figure 3B:
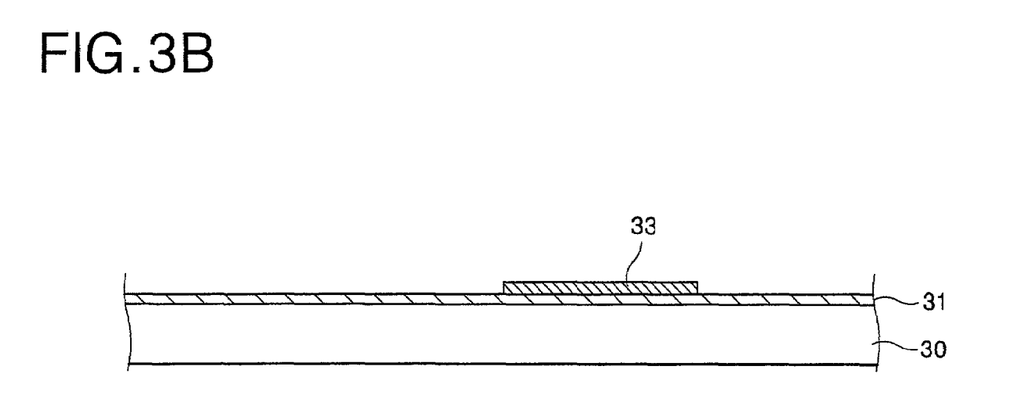

FIGS. 3A to 3L are cross-sectional views illustrating a thin film transistor (TFT) according to an embodiment of the present invention. FIG. 3A shows a buffer layer 31 formed on a transparent substrate 30. A polycrystalline silicon layer 32 is deposited on the buffer layer 31 and then patterned using a first mask to form a semiconductor layer 33 as shown in FIG. 3B.

In order to form the semiconductor layer 33, an amorphous silicon layer can be deposited and then be crystallized through, for example, a laser annealing process to form the polycrystalline silicon layer 32. The polycrystalline silicon layer 32 is patterned to form the semiconductor layer 33 in a form of an island.

The buffer layer 31 is an oxide layer, such as $SiO_2$, and serves to shield impurities, such as a sodium ion, from being diffused from the substrate 30 into the semiconductor layer 33.

Figure 3C:
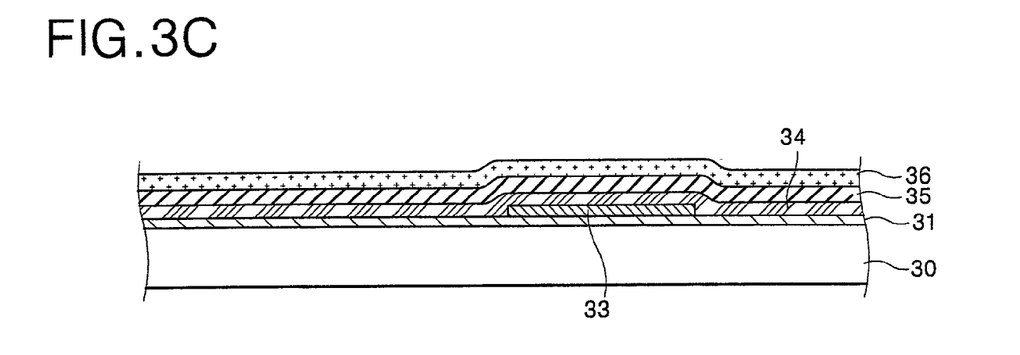
Figure 3D:
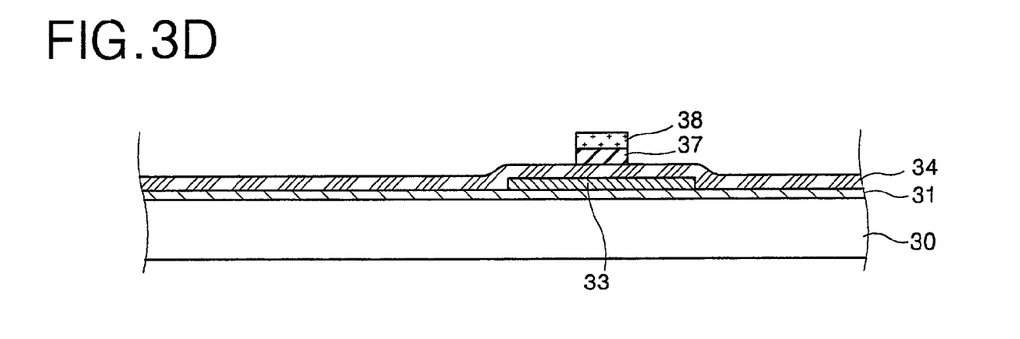

FIGS. 3C and 3D show that a first insulating layer 34, a first metal layer 35 and a second insulating layer 36 are sequentially deposited over the whole surface of the substrate 30 so as to cover the semiconductor layer 33. The first insulating layer 34 serves as a gate insulating layer. The first and second insulating layers 34 and 36 are made of an oxide layer (e.g., $SiO_2$) or a nitride layer (e.g., $SiN_x$).

The first metal layer 35 and the second insulating layer 36 are patterned using a second mask to form a gate electrode 37 and a capping layer 38 over the semiconductor layer 33.

Figure 3E:
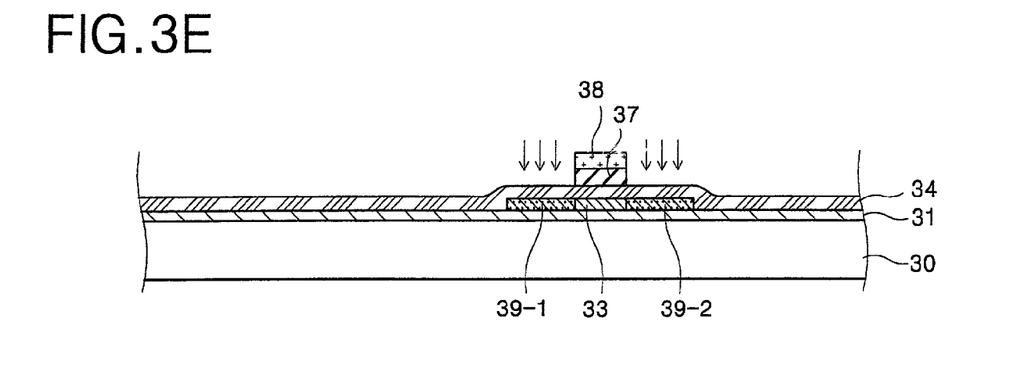

FIG. 3E shows that a low-density impurity, such as a n-type or a p-type low-density impurity, is then ion-implanted into both end portions of the semiconductor layer 33 using the gate electrode 37 as a mask to form low-density source and drain regions 39-1 and 39-2. At this time, the capping layer 38 shields the low-density impurity from being ion-implanted into the gate electrode 37, thereby preventing defects, such as a hillock or a crack, in the gate electrode 37.

Figure 3F:
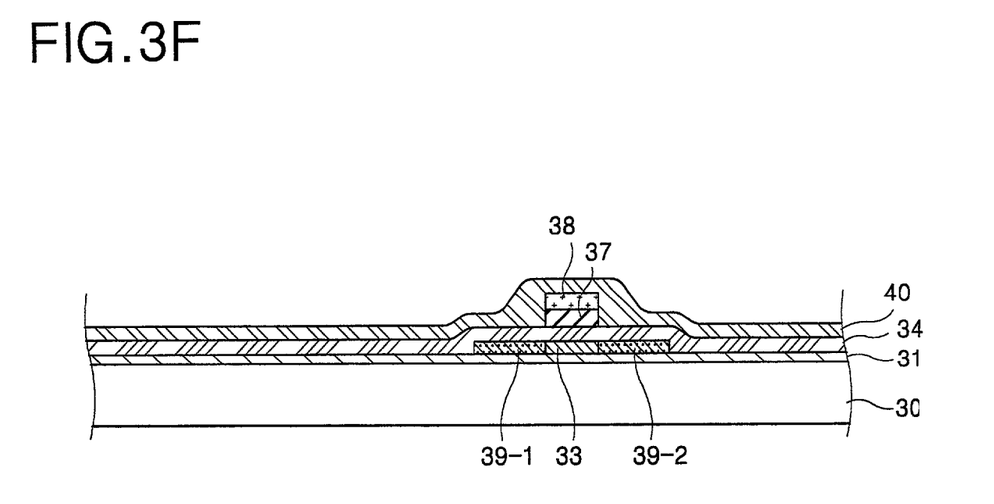
Figure 3G:
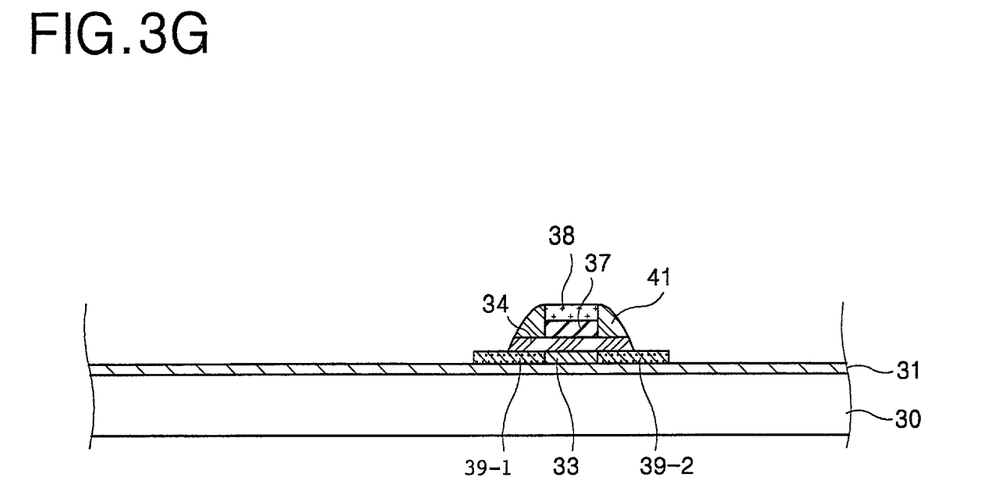

FIGS. 3F and 3G show that a third insulating layer 40 is deposited over the whole surface of the substrate 30. The third insulating layer 40 is then etched-back to form spacers 41 on both side wall portions of the gate electrode 37 and the capping layer 38 so that the gate electrode 37 is perfectly insulated by the capping layer 38 and the spacers 41. An oxide layer or a nitride layer is used as the third insulating layer 40. At the same time, the first insulating layer 34 is etched to expose end portions of the low-density source and drain regions 39-1 and 39-2.

Figure 3H:
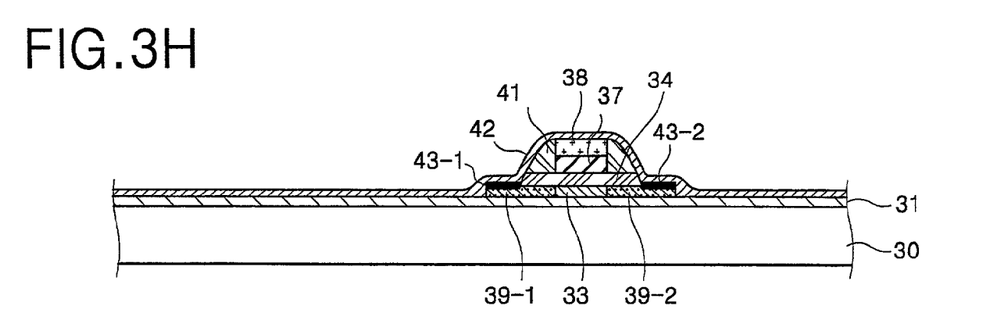
Figure 3I:
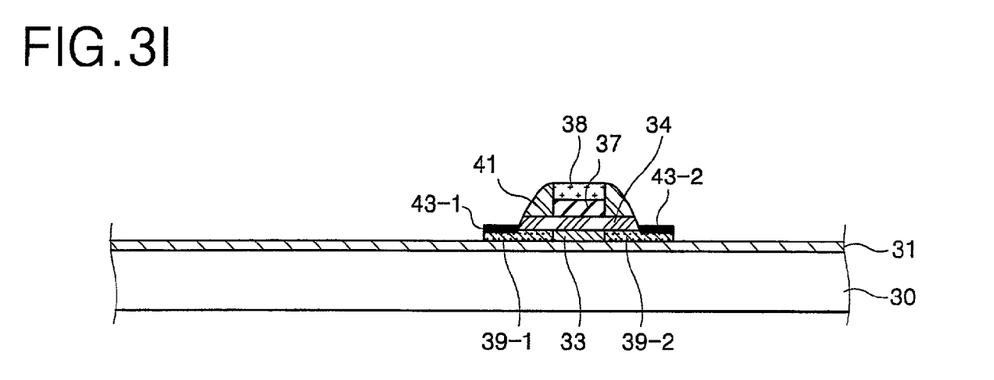

Next, FIGS. 3H and 3I show that a second metal layer 42 is deposited over the whole surface of the substrate 30 and then reacted with silicon of the semiconductor layer 33 through a silicide process to form silicide layers 43-1 and 43-2 on the exposed portions of the low-density source and drain regions 39-1 and 39-2, respectively. The second metal layer 42 is made of a refractory metal such as Cr or Ni. The portions of the second metal layer 42 that do not react with the silicon are removed.

Figure 3J:
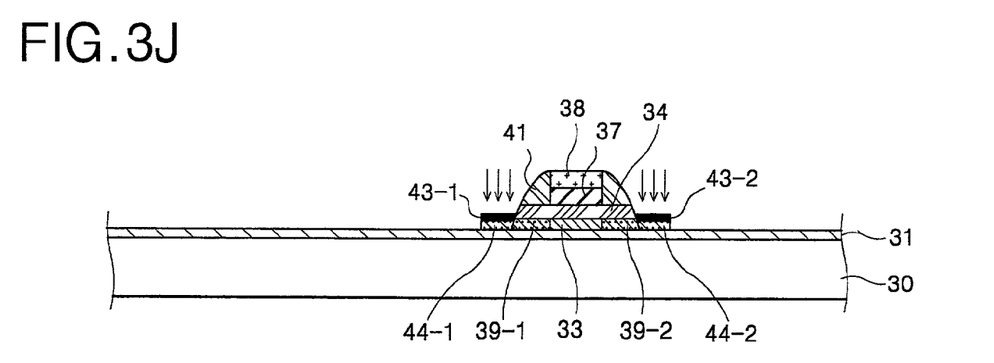

FIG. 3J shows that by using the gate electrode 37, the capping layer 38 and the spacers 41 as a mask, a high-density impurity having the same conductivity type as the source and drain regions 39-1 and the 39-2 is ion-implanted into the exposed portion of the low-density source and drain regions 39-1 and 39-2 in a self-aligning manner to form high-density source and drain regions 44-1 and 44-2. The TFT of the FIG. 3J has an LDD structure.

Since the high-density impurity is ion-implanted into the semiconductor layer 33 through the silicide layers 43-1 and 43-2, the semiconductor layer 33 is protected by the suicide layers 43-1 and 43-2, thereby minimizing damage to the semiconductor layer 33 due to the ion-implantation.

Figure 3K:
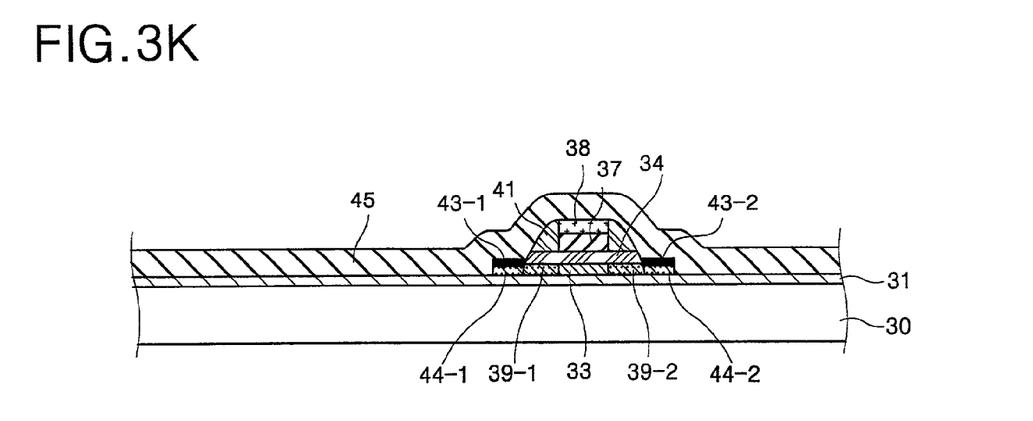
Figure 3L:
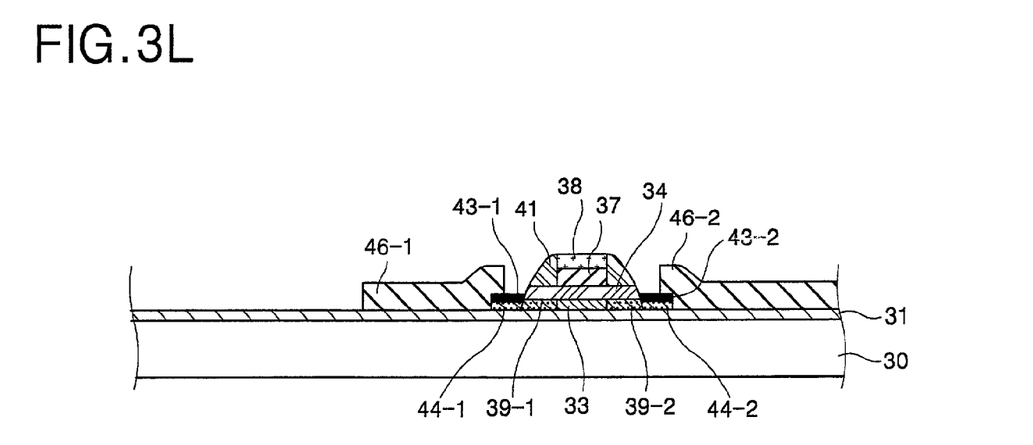

Finally, FIGS. 3K and 3L show that a third metal layer 45 is deposited over the whole surface of the substrate 30 and then patterned using a third mask to form source and drain electrodes 46-1 and 46-2. The source and drain electrodes 46-1 and 46-2 directly contact the high-density source and drain regions 44-1 and 44-2 through the silicide layers 43-1 and 43-2, respectively and without using contact holes.

In order to form an off-set structure instead of an LDD structure according to a further embodiment of the present invention, a process of ion-implanting a low-density impurity of FIG. 3E can be omitted.

According to an embodiment of the present invention, the three mask processes are used to simplify the manufacture of the TFT. For example, since the high-density source and drain regions 44-1 and 44-2 are formed in a self-aligning manner using the spacers 41 as a mask, an additional anodizing process is not required. Also, since the source and drain electrodes 46-1 and 46-2, without contact holes, directly contact the high-density source and drain regions, one of the masking processes can be omitted.

In addition, since the silicide layers 43-1 and 43-2 are formed between the high-density source and drain regions 44-1 and 44-2 and the source and drain electrodes 46-1 and 46-2, respectively, a contact resistance can be reduced. Furthermore, the silicide layers 43-1 and 43-2 serve as an etching barrier for the source and drain electrodes to improve an etching selectivity, and also serve to minimize the damage to the semiconductor layer 33 due to the ion-implantation, since the high-density impurity is ion-implanted through the silicide layers 43-1 and 43-2.

The TFT according to the embodiment of the present invention has an LDD structure or an off-set structure, and improved electric characteristics. For example, since an off current is reduced, an on/off current ratio can be improved.

In addition, since the gate electrode 37 is insulated from the source and drain electrodes 46-1 and 46-2 by the capping layer 38 and the spacers 41, a sufficient insulation between the gate electrode 37 and the source and drain electrodes 46-1 and 46-2 can be secured without the interlayer insulator 18 having contact holes 19-1 and 19-2 that provide a contact between the source and drain regions 17-1 and 17-2 and the source and drain electrodes 20-1 and 20-2 as shown in FIG. 1.

Figure 4:
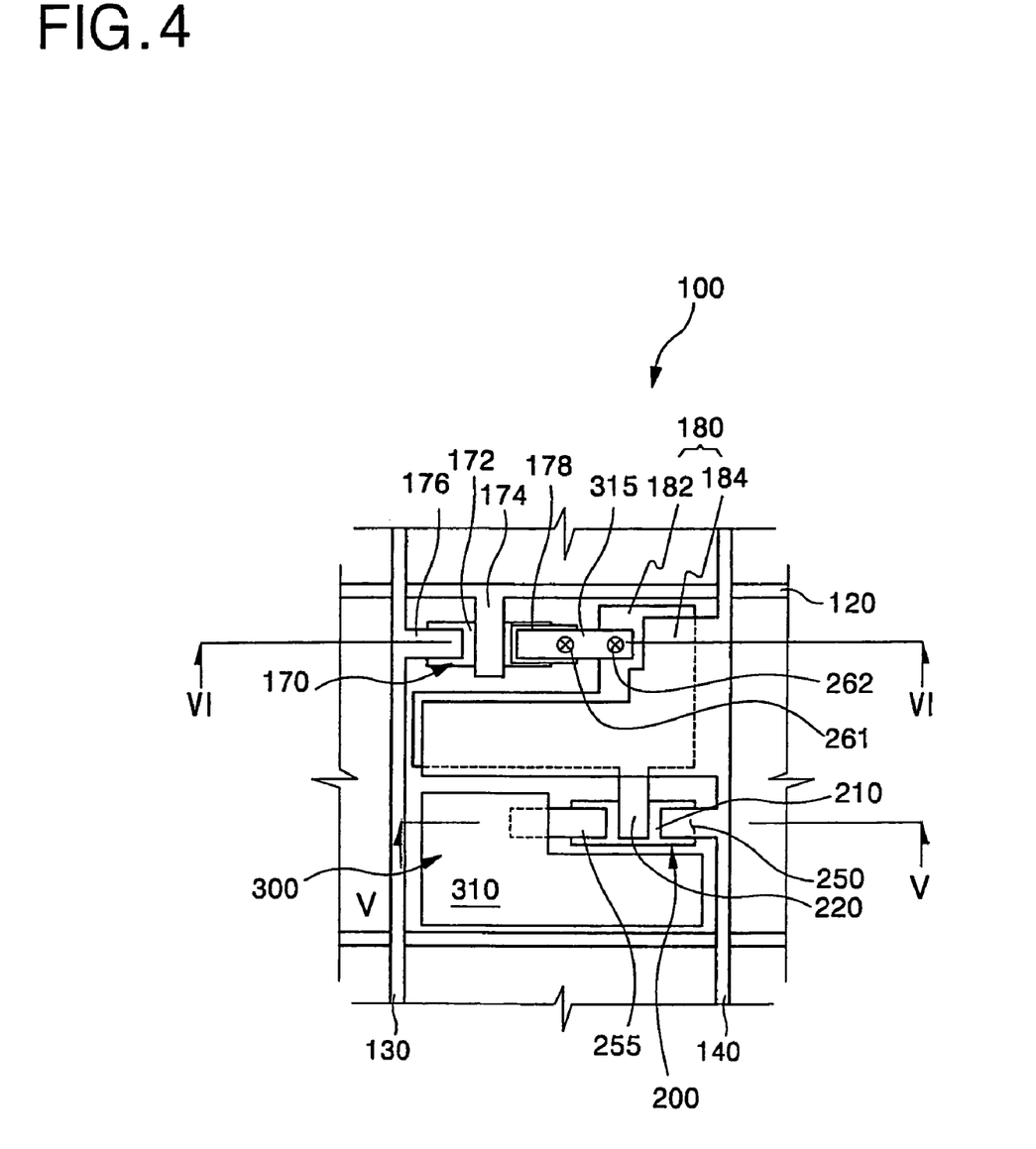
FIG. 4 is a diagram illustrating a plane view of a portion of an organic EL display device according to the present invention.

An organic EL display device includes a transparent insulating substrate, signal lines and a pixel connected to the signal lines. FIG. 4 is a plan view illustrating a portion of an organic EL display device 100 according to an embodiment of the present invention. A gate line 120 applies a signal to turn on or off TFTs of a pixel 160. A data line 130 applies a data voltage to the pixel 160. A power supply line 140 is arranged in a parallel direction to the data line 130 and applies an electrical power to the pixel 160 while the organic EL display device 100 is driven.

Each of the pixel 160 includes a switching TFT 170, a storage capacitor 180, a driving TFT 200, and an organic EL element 300. The switching TFT 170 is arranged at an intersection of the gate line 120 and the data line 130 and is driven by a signal applied from the gate line 120. The switching TFT 170 has a semiconductor layer 172, a gate electrode 174, a source electrode 176, and a drain electrode 178. The gate electrode 174 extends from the gate line 120, and the source electrode 176 extends from the data line 130. The source and drain electrodes 176 and 178 directly contact the semiconductor layer 172 in which high-density source and drain regions (not shown) are formed, respectively, without contact holes.

The storage capacitor 180 is connected between the switching TFT 170 and the corresponding power supply line 140 and serves to maintain data applied from the data line 130 so that the organic EL display device 100 can maintain the data during one frame. The storage capacitor 180 includes first and second capacitor electrodes 182 and 184 with a dielectric layer (not shown) interposed therebetween. The first capacitor electrode 182 is connected to the drain electrode 178 of the switching TFT 170 through a connection pad 315 (see FIG. 6). The second capacitor electrode 184 extends from the power supply line 140. In other words, the drain electrode 178 of the switching TFT 170 is connected to the connection pad 315 through a contact hole 261, and the first capacitor electrode 182 is connected to the connection pad 315 through a contact hole 262, whereby the switching TFT 170 is electrically connected to the capacitor 180.

The first capacitor electrode 182 is made of the same material as the gate line 120 and the gate electrode 174, and is formed at the same time as the gate line 120 and the gate electrode 174. The second capacitor electrode 184 is made of the same material as the source and drain electrode 176 and 178 and the power supply line 140, and is formed at the same time as the source and drain electrode 176 and 178 and the power supply line 140.

The driving TFT 200 is connected to the power supply line 140 and the storage capacitor 180, and serves to drive the organic EL element 300. The driving TFT 200 includes a semiconductor layer 210, a gate electrode 220, a source electrode 250, and a drain electrode 255. The gate electrode 220 of the driving TFT 200 extends from the first capacitor electrode 182, and the source electrode 250 of the driving TFT 200 extends from the power supply line 140. The source and drain electrodes 250 and 255 directly contact the semiconductor layer 210, without contact holes. The drain electrode 255 of the driving TFT 200 contacts an anode 310 of the organic EL element 300 through an opening portion 267 (shown in FIGS. 5C-5E). As such, the driving TFT 200 is electrically connected to the organic EL element 300.

A process of manufacturing the organic EL display device 100 according to an embodiment of the invention is explained in detail below with reference to FIGS. 5A to 5F and 6. FIGS. 5A to 5F are cross-sectional views taken along line V-V of FIG. 4, and FIG. 6 is a cross-sectional view taken along line VI-VI of FIG. 4.

Figure 5A:
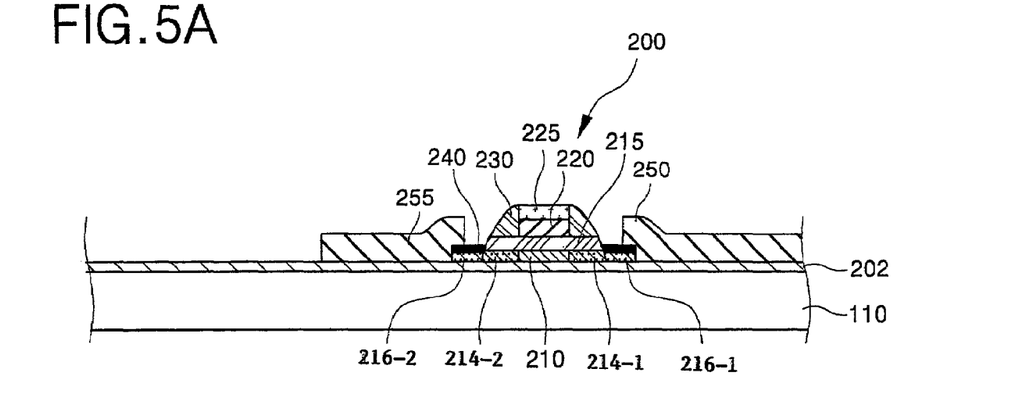
Figure 6:
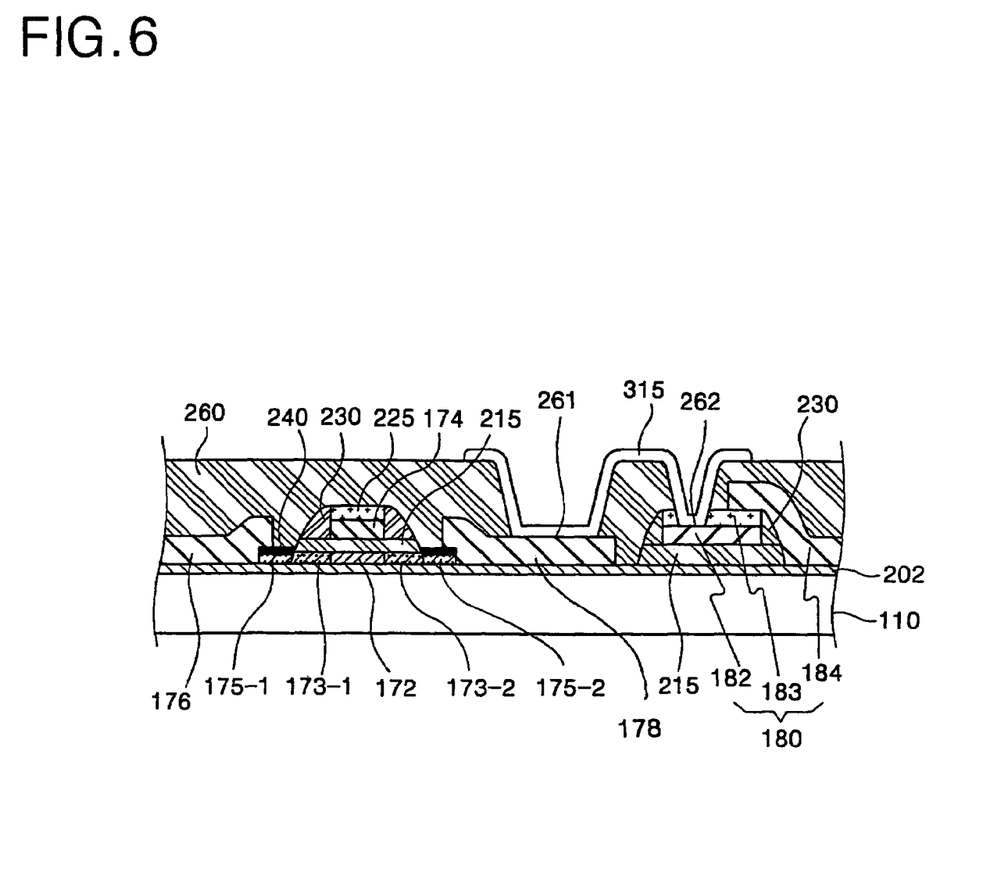
FIG. 6 is a diagram illustrating a cross-sectional view taken along line VI-VI of FIG. 4 illustrating the organic EL display device according to the present invention having a switching TFT.

FIG. 5A shows that a buffer layer 202 is formed on a transparent substrate 110. The buffer layer 202 is made of, for example, $SiO_2$. A polycrystalline silicon layer is deposited on the buffer layer 202 and then patterned using a first mask to form a semiconductor layer 210 of a driving TFT 200. At this time, a semiconductor layer 172 of a switching TFT 170 (see FIG. 6) is formed at the same time as the semiconductor layer 210 of the switching TFT 200.

A gate insulating layer 215 is formed over the whole surface of the substrate 110 using a second mask, and a gate electrode 220 and a capping layer 225 are formed on the gate insulating layer 215 over the semiconductor layer 210. At the same time, a gate electrode 174 and a capping layer 225 of the switching TFT 170, a first capacitor electrode 182 and a dielectric layer 183 (see FIG. 6) are formed. The gate line 120 (see FIG. 4) is formed at the same time as the gate electrode 220. The gate insulating layer 215 and the capping layer 225 are made of, for example, $SiO_2$ or $SiN_x$.

Then, a low-density impurity, such as an n-type or a p-type low-density impurity, is ion-implanted into both end portions of the semiconductor layer 210 using the gate electrode 220 as a mask to form low-density source and drain regions 214-1 and 214-2 of the driving TFT 200.

At the same time, a low-density impurity is ion-implanted into both end portions of the semiconductor layer 172 using the gate electrode 174 as a mask to form low-density source and drain regions 173-1 and 173-2 of the switching TFT 170 (see FIG. 6).

The capping layers 225 of FIG. 5A and FIG. 6 serve as impurity barriers that shield the low-density impurity from being ion-implanted into the gate electrodes 174 and 220. Also, the dielectric layer 183 of FIG. 6 serves to shield the low-density impurity form being ion-implanted into the first capacitor electrode 182. Referring to FIGS. 5A and 6, a portion of the semiconductor layer 172 between the low-density source and drain regions 173-1 and 173-2 and a portion of the semiconductor layer 210 between the low-density source and drain regions 214-1 and 214-2 serve as channel areas of the TFTs 170 and 200, respectively.

Subsequently in FIG. 5A, an insulating layer for spacers is deposited over the whole surface of the substrate 110 and then etched-back to form spacers 230 on both side wall portions of the gate electrode 220 and the capping layer 225. Thus, the gate electrode 220 is perfectly insulated by the capping layer 225 and the spacers 230. An oxide layer or a nitride layer is used as the insulating layer for spacers. The gate insulating layer 215 is also etched to expose end portions of the low-density source and drain regions 214-1 and 214-2.

At the same time, spacers 230 (see FIG. 6) are also formed on both side wall portions of the gate electrode 174 of the switching TFT and of the first capacitor electrode 182. And, when the gate insulating layer 215 (FIG. 6) of the switching TFT 170 is etched, end portions of the low-density source and drain regions 173-1 and 173-2 are exposed.

Next, FIG. 5A and FIG. 6 show that silicide layers 240 are formed on the exposed portions of the low-density source and drain regions 214-1 and 214-2 and on the exposed portions of the low-density source and drain regions 173-1 and 173-2, respectively.

Subsequently, using the gate electrode 220 and the spacers 230 as a mask, a high-density impurity having the same conductivity as the low-density source and drain regions 214-1 and 214-2 is ion-implanted into the exposed portion of the low-density source and drain regions 214-1 and 214-2 in a self-aligning manner to form high-density source and drain regions 216-1 and 216-2.

At the same time, high-density source and drain regions 175-1 and 175-2 of the switching TFT (see FIG. 6) are formed under the silicide layers 240. The TFTs 170 and 200 of FIG. 5A and FIG. 6 have an LDD structure.

Since the high-density impurity is ion-implanted into the semiconductor layers 172 and 210 through the silicide layers 240, the semiconductor layers 172 and 210 are protected by the silicide layers 240, thereby minimizing damage to the semiconductor layers 172 and 210 due to the ion-implantation.

Finally in FIG. 5A, a metal layer for source and drain electrodes is deposited over the whole surface of the substrate 110 and then patterned using a third mask to form the source and drain electrodes 250 and 255. The source and drain electrodes 250 and 255 directly contact the high-density source and drain regions 216-1 and 216-2 through the silicide layers 240, respectively, and without the contact holes 19-1 and 19-2 shown in FIG. 1.

At the same time, the source and drain electrodes 176 and 178 of the switching TFT 170 (see FIG. 6) are formed to directly contact the high-density source and drain regions 175-1 and 175-2 through the suicide layers 240, respectively. Even though not shown, the data line 130 and the power supply line 140 are also formed at the same time (referring to FIG. 4).

In order to form an off-set structure instead of an LDD structure, a process of ion-implanting a low-density impurity can be omitted.

Figure 5B:
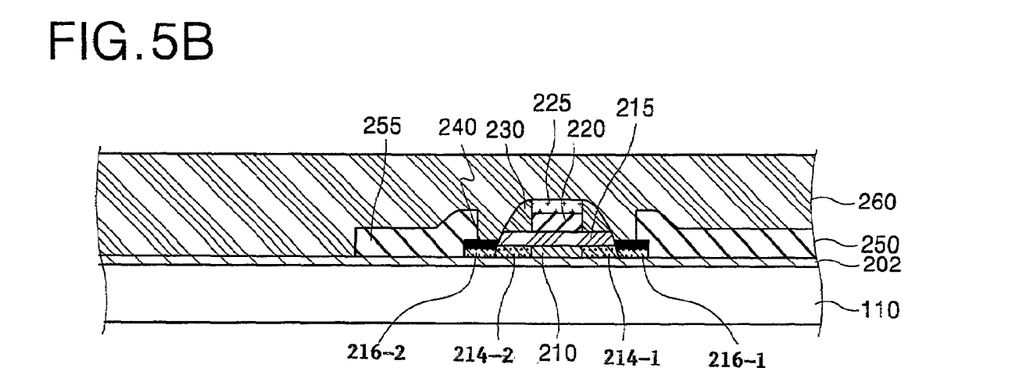
Figure 5C:
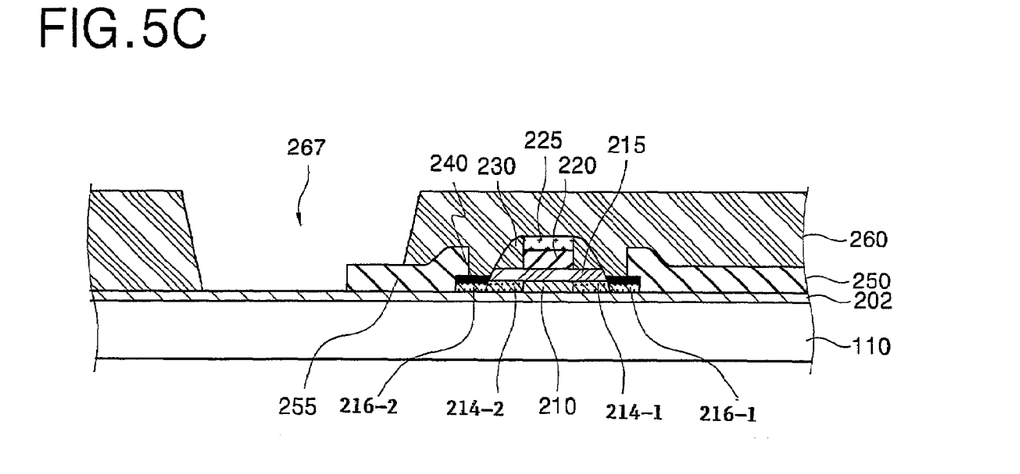

FIGS. 5B and 5C show that a planarization layer 260 is formed over the whole surface of the substrate 110. The planarization layer 260 is etched using a fourth mask to form an opening portion 267. The opening portion 267 exposes an end portion of the drain electrode 255 of the driving TFT 200 and a portion of the buffer layer 202.

The contact holes 261 and 262 (See FIG. 6) are formed on a portion of the drain electrode 178 of the switching TFT 170 and a portion of the first capacitor electrode 182 when the opening portion 267 is formed.

Figure 5D:
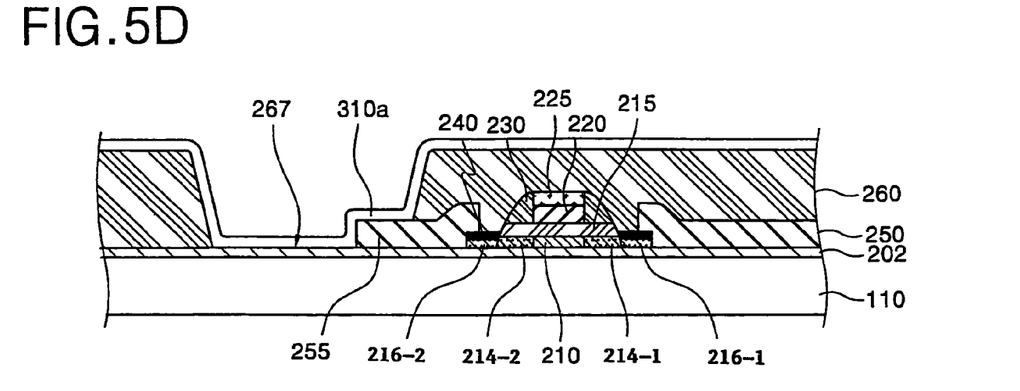
Figure 5E:
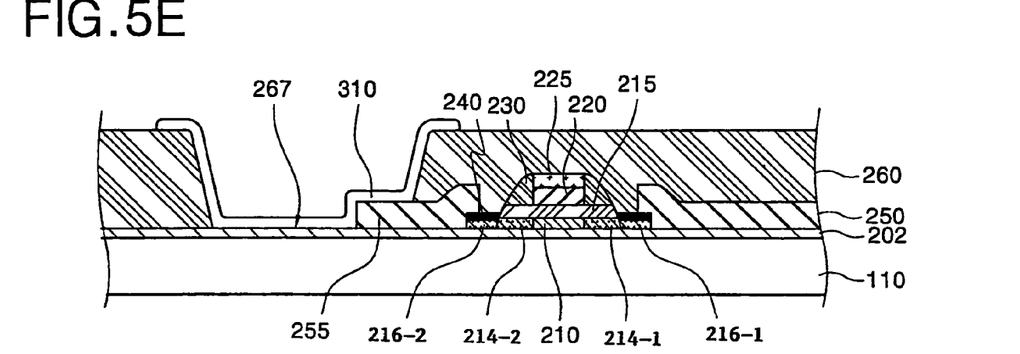

FIGS. 5D and 5E show that a transparent conductive material layer 310a is deposited over the whole surface of the substrate 110 and then patterned using a fifth mask to form a pixel electrode 310 that contacts the drain electrode 255 through the opening portion 267. The pixel electrode 310 is made of a transparent conductive material such as indium tin oxide (ITO) or indium zinc oxide (IZO) and is used as an anode electrode of an organic EL element 300 (see FIG. 4).

A connection pad 315 (see FIG. 6) is formed to electrically connect the drain electrode 178 and the first capacitor electrode 182 through the contact holes 261 and 262.

Figure 7:
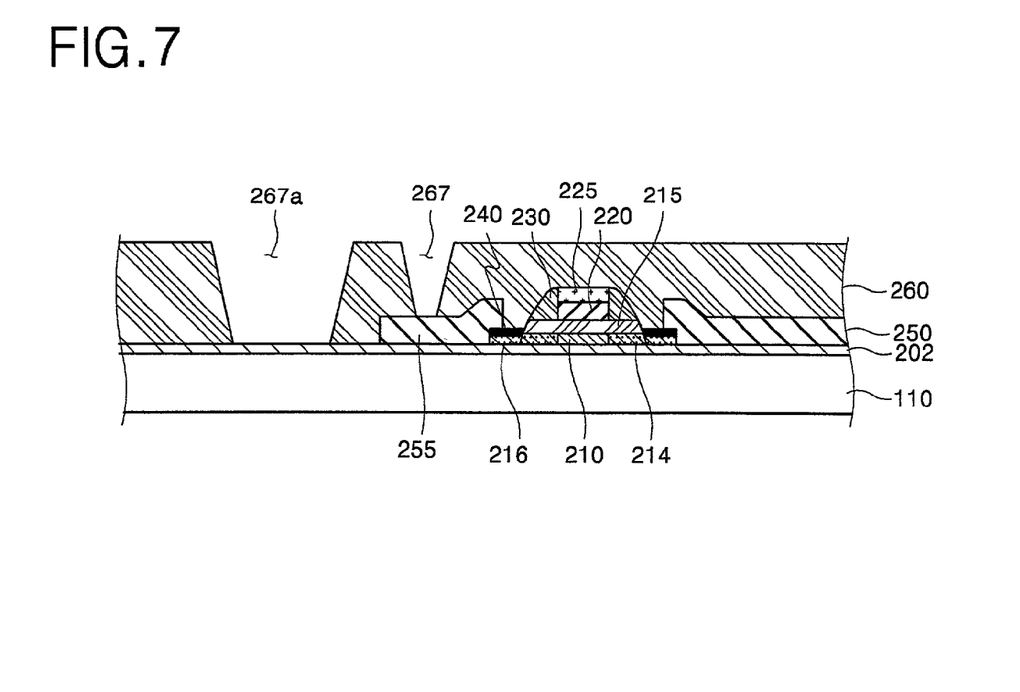
FIG. 7 is a diagram illustrating a cross-sectional view of yet another embodiment of the present invention with two opening portions formed to expose a portion of a buffer layer and a portion of a drain electrode.
Figure 8:
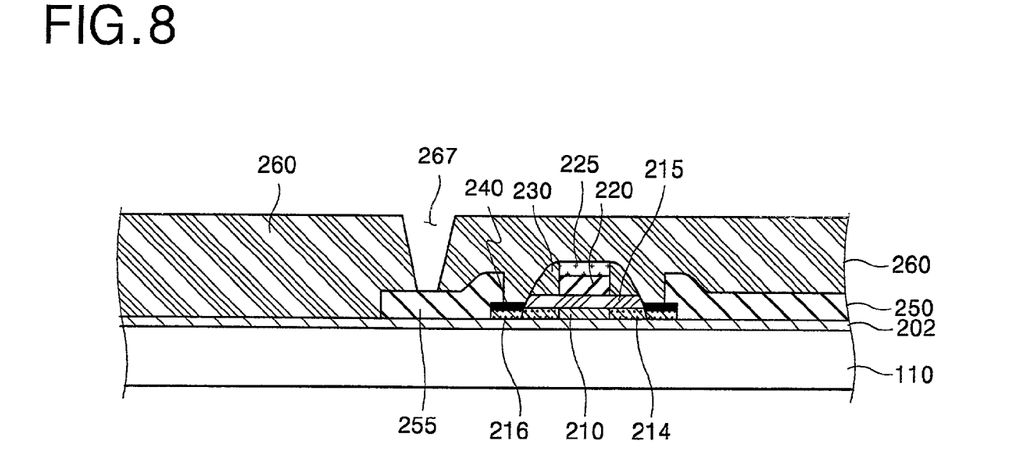
FIG. 8 is a diagram illustrating a cross-sectional view of still another embodiment of the present invention with a opening portion formed to expose a portion of a drain electrode.

Alternatively, in order to contact the pixel electrode 310 and the drain electrode 255 instead of using the method shown in FIG. 5C according to another embodiment of the invention shown in FIG. 7, two opening portions 267 and 267a are formed to expose a portion of the drain electrode 255 and a portion of the buffer layer 202, respectively. Otherwise, according to yet another embodiment of the invention shown in FIG. 8, one opening portion 267 that exposes a portion of the drain electrode 255 can be formed.

Figure 5F:
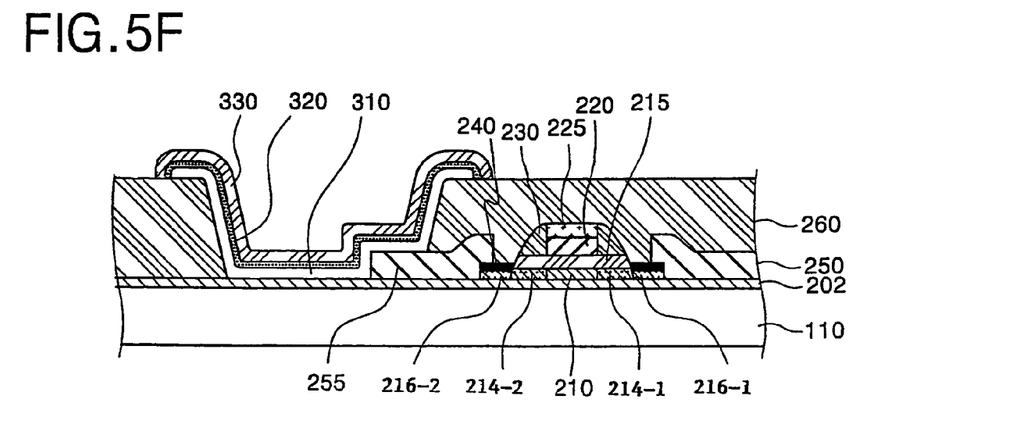

However the opening portion 267 is formed, FIG. 5F shows that an organic EL layer 320 and a cathode electrode 330 are sequentially formed on the anode electrode 310 and the planarization layer 260. The organic EL layer 320 and the cathode electrode 330 are not formed over the storage capacitor 180 and the TFTs 170 and 200 (see FIG. 4 and FIG. 6). The cathode electrode 330 is preferably made of a metal having a lower work function than the anode electrode 310.

Even though not shown, the organic EL layer 320 includes a hole transfer layer, a light-emitting layer and an electron transfer layer. The hole transfer layer transfers holes from the anode electrode 310 to the light-emitting layer, and the electron transfer layer transfers electrons from the cathode electrode 330 to the light-emitting layer, so that holes and electrons are recombined to emit light. That is, holes and electrons are recombined so that organic molecules that constitute the light-emitting layer are excited, to emit excitons, and the emitted excitons become inactivated, whereupon light radiates from the light-emitting layer.

As described above, the active matrix display device according to the embodiments of the present invention have the following advantages. Since the source and drain electrodes directly contact the source and drain regions without contact holes, the number of mask processes is reduced, thereby simplifying a manufacturing process. Furthermore, since only five mask processes are required to manufacture the active matrix display device, the overall manufacturing process is simplified, leading to a higher manufacturing yield and a lower production cost. Also, since the capping layer is formed on the gate electrode of the TFT while an ion-implanting process is performed to form the low-density source and drain regions, damage to the gate electrode is prevented. In addition, due to the silicide layers respectively formed between the source and drain regions and the source and drain electrodes, a contact resistance is reduced, leading to a high reliability. In addition, since an LDD region or an off-set region is formed in a self-aligning manner through the spacers formed on both side wall portions of the gate electrode and the capping layer, the manufacturing process is again simplified, and the electric characteristics such as an on/off current ratio are improved.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A thin film transistor (TFT), comprising:
   a substrate;
   a semiconductor layer formed over said substrate having end portions;
   a first insulating layer disposed on said semiconductor layer so as to expose end portions of said semiconductor layer;
   a gate electrode formed over said first insulating layer;
   a capping layer formed over said gate electrode;
   spacers formed over said first insulating layer and directly contacting both side wall portions of said gate electrode and said capping layer;
   high-density source and drain regions formed at the end portions of said semiconductor layer exposed beyond said spacers, the high-density source and drain regions being spaced apart from the gate electrode and the capping layer;
   low-density source and drain regions having a same conductivity as said high-density source and drain regions formed at regions of said semiconductor layer under said spacers between the gate electrode and the high-density source and drain regions, thereby providing said semiconductor layer with lightly doped drain (LDD) regions under said spacers; and source and drain electrodes which respectively contact said high-density source and drain regions without contact holes.

2. The TFT of claim 1, wherein said first insulating layer, said capping layer and said spacer are one of an oxide layer and a nitride layer.

3. The TFT of claim 1, further comprising a silicide layer formed between said source electrode and said high-density source region and a silicide layer formed between said drain electrode and said high-density drain region.

4. The TFT of claim 3, wherein said silicide layers comprise a refractory metal.

5. The TFT of claim 1, wherein said high-density source and drain regions and said low-density source and drain regions extend through an entire thickness of said semiconductor layer.

6. The TFT of claim 1, wherein said high-density source and drain regions are formed at entireties of the end portions of said semiconductor layer exposed beyond said spacers; and
wherein said low-density source and drain regions having a same conductivity as said high-density source and drain regions are formed at entireties of regions of said semiconductor layer entirely under said spacers between the gate electrode and the high-density source and drain regions, thereby providing said semiconductor layer with lightly doped drain (LDD) regions entirely under said spacers.

7. The TFT of claim 1, wherein the source and drain electrodes do not contact the high-density source and drain regions via any electrode material filling any contact holes.

8. The TFT of claim 1, wherein the capping layer and the spacers are separate layers.

9. The TFT of claim 1, wherein the source and drain electrodes do not contact the capping layer; and
wherein the source and drain electrodes do not contact the spacers.

10. The TFT of claim 1, wherein:
the source and drain electrodes do not contact the high-density source and drain regions via any electrode material filling any contact holes;
the source and drain electrodes do not contact the capping layer; and
the source and drain electrodes do not contact the spacers.

11. The TFT of claim 10, wherein the capping layer and the spacers are separate layers.

12. An active matrix display device, comprising:
a substrate;
a semiconductor layer having end portions formed over said substrate;
a first insulating layer formed over said semiconductor layer so as to expose end portions of said semiconductor layer;
a gate electrode formed over said first insulating layer;
a capping layer formed over said gate electrode;
spacers formed over said first insulating layer and directly contacting both side wall portions of said gate electrode and said capping layer;
high-density source and drain regions formed at entireties of the end portions of said semiconductor layer exposed beyond said spacers;
low-density source and drain regions having a same conductivity as said high-density source and drain regions formed at entireties of off-set regions of said semiconductor layer entirely under said spacers, thereby providing said semiconductor layer with lightly doped drain (LDD) regions entirely under said spacers;
source and drain electrodes which respectively contact said high-density source and drain regions without contact holes;
a planarization layer having an opening portion which exposes a portion of one of said source and drain electrodes; and
a pixel electrode formed on the planarization layer, the pixel electrode contacting the portion of the one of the source and drain electrodes through the opening portion.

13. The active matrix display device of claim 12, further comprising a silicide layer formed between said source electrode and said high-density source region and a silicide layer formed between said drain electrode and said high-density drain region.

14. The active matrix display device of claim 12, further comprising an organic electro-luminescence (EL) layer and a cathode electrode sequentially formed on a first predetermined area of said pixel electrode and on a second predetermined area of said planarization layer.

15. The active matrix display device of claim 12, wherein said high-density source and drain regions and said low-density source and drain regions extend through an entire thickness of said semiconductor layer.

16. The active matrix display device of claim 12, wherein the source and drain electrodes do not contact the high-density source and drain regions via any electrode material filling any contact holes.

17. The active matrix display device of claim 12, wherein the capping layer and the spacers are separate layers.

18. The active matrix display device of claim 12, wherein the source and drain electrodes do not contact the capping layer; and
wherein the source and drain electrodes do not contact the spacers.

19. The active matrix device of claim 12, wherein:
the source and drain electrodes do not contact the high-density source and drain regions via any electrode material filling any contact holes;
the source and drain electrodes do not contact the capping layer; and
the source and drain electrodes do not contact the spacers.

20. The active matrix display device of claim 19, wherein the capping layer and the spacers are separate layers.

* * * * *